(12) United States Patent
Tanaka

(10) Patent No.: US 11,167,966 B2
(45) Date of Patent: Nov. 9, 2021

(54) STACKER CRANE

(71) Applicant: MURATA MACHINERY, LTD., Kyoto (JP)

(72) Inventor: Hiroshi Tanaka, Inuyama (JP)

(73) Assignee: MURATA MACHINERY, LTD., Kyoto (JP)

(*) Notice: Subject to any disclaimer, the term of this patent is extended or adjusted under 35 U.S.C. 154(b) by 241 days.

(21) Appl. No.: 16/383,874

(22) Filed: Apr. 15, 2019

(65) Prior Publication Data

US 2019/0241415 A1 Aug. 8, 2019

Related U.S. Application Data

(63) Continuation of application No. PCT/JP2017/033696, filed on Sep. 19, 2017.

(30) Foreign Application Priority Data

Oct. 18, 2016 (JP) .............................. JP2016-204184

(51) Int. Cl.
*B66F 9/07* (2006.01)
*B65G 1/02* (2006.01)
*B65G 1/04* (2006.01)

(52) U.S. Cl.
CPC .............. *B66F 9/072* (2013.01); *B65G 1/023* (2013.01); *B65G 1/04* (2013.01); *B65G 1/0407* (2013.01); *B66F 9/07* (2013.01)

(58) Field of Classification Search
CPC . B66F 9/07; B66F 9/072; B65G 1/023; B65G 1/04; B65G 1/0407
See application file for complete search history.

(56) References Cited

U.S. PATENT DOCUMENTS

2002/0039527 A1 4/2002 Kamide
2006/0182550 A1* 8/2006 Lee ...................... E04H 6/185
414/277

(Continued)

FOREIGN PATENT DOCUMENTS

CN 105775544 A 7/2016
JP 06-048513 A 2/1994

(Continued)

OTHER PUBLICATIONS

Official Communication issued in International Patent Application No. PCT/JP2017/033696, dated Dec. 12, 2017.

(Continued)

*Primary Examiner* — Saul Rodriguez
*Assistant Examiner* — Ashley K Romano
(74) *Attorney, Agent, or Firm* — Keating & Bennett, LLP

(57) ABSTRACT

A stacker crane that prevents an increase in facility cost while lightening a mast and transfers an article to a target position, includes a traveling carriage including a carriage driver and traveling on a track provided on a ceiling of a facility, a mast suspended from the traveling carriage, an elevating platform vertically movable and guided along the mast, a transfer conveyor to transfer an article, a stopper to fix the mast, a switch to switch a state of the mast between a fixed and released states by the stopper, in which the switch releases the fixing of the stopper to allow a lower portion of the mast to follow an upper portion of the mast in the traveling direction when the carriage driver drives the traveler, the stopper fixes the mast when the carriage driver stops the traveling carriage.

21 Claims, 9 Drawing Sheets

(56) References Cited

U.S. PATENT DOCUMENTS

| | | | |
|---|---|---|---|
| 2015/0158670 A1* | 6/2015 | Kainuma | B66F 9/07 |
| | | | 414/277 |
| 2016/0130083 A1* | 5/2016 | Abe | H01L 21/67775 |
| | | | 414/276 |
| 2017/0152106 A1* | 6/2017 | Hofmann | B65G 1/0407 |
| 2017/0267454 A1* | 9/2017 | Adachi | B65G 1/0407 |

FOREIGN PATENT DOCUMENTS

| | | |
|---|---|---|
| JP | 2005-015089 A | 1/2005 |
| JP | 2008-074541 A | 4/2008 |
| JP | 2013-124174 A | 6/2013 |
| KR | 1997-0026892 A | 6/1997 |
| KR | 1999-0039384 A | 6/1999 |

OTHER PUBLICATIONS

Official Communication issued in corresponding Chinese Patent Application No. 201780063827.9, dated Apr. 29, 2021.

\* cited by examiner

STACKER CRANE

CROSS REFERENCE TO RELATED APPLICATIONS

This application claims the benefit of priority to Japanese Patent Application No. 2016-204184 filed on Oct. 18, 2016 and is a Continuation Application of PCT Application No. PCT/JP2017/033696 filed on Sep. 19, 2017. The entire contents of each application are hereby incorporated herein by reference.

BACKGROUND OF THE INVENTION

1. Field of the Invention

The present invention relates to a stacker crane.

2. Description of the Related Art

A stacker crane for transferring an article is used in an automated storage and a facility such as an intrabay in which processing machine is arranged (One example is described in Japanese Patent No. 3591638). The stacker crane includes, for example, a traveling carriage traveling along a track provided on a floor surface of a facility, a mast extending upward from the traveling carriage, an elevating platform moving along the mast, and a transfer device provided on the elevating platform. Such a stacker crane is capable of moving the entire stacker crane by a carriage driver of the traveling carriage, the longer the mast is, or the larger the acceleration of the traveling carriage is, the stress and moment applied to the connecting part between the mast and the traveling carriage become larger. As a result, higher rigidity is required for the mast, and thus, the weight of the mast becomes heavier.

The stacker crane of Japanese Patent No. 3591638 includes travelling carriages (vehicles) at the upper and lower positions. The mast is swingably attached to each of the upper and lower traveling carriages. Additionally, the mast is attached to one of the traveling carriages so as to freely shift in the vertical direction. In such a stacker crane, the stress and moment applied to the connecting part between the mast and the traveling carriage can be reduced. As a result, the weight of the stacker crane of Japanese Patent No. 3591638 decreases.

The stacker crane of Japanese Patent No. 3591638 enables to reduce the weight of the mast, however, it requires two traveling carriages such as at least one upper and one lower traveling carriages. As a track such as a rail is required for the lower traveling carriage traveling on the floor surface, it is necessary to lay a large number of rails on the floor surface in the facility, and an increase in cost is incurred. As the mast is attached swingably with respect to the traveling carriage, the position of the mast relative to the transfer destination of the article may be displaced. Thus, the position of the elevating platform is deviated from the transfer destination. As a result, it is difficult to transfer the article to a target position.

SUMMARY OF THE INVENTION

Preferred embodiments of the present invention provide stacker cranes that prevent any increases in facility cost while reducing a weight of a mast and transfers an article to a target position.

A stacker crane according to a preferred embodiment of the present invention includes a carriage driver, a traveling carriage which travels on a track provided on a ceiling side of the facility, a mast suspended from the traveling carriage, an elevating platform which is vertically movable and guided along the mast, a transfer conveyor to transfer an article to the elevating platform, a stopper to fix the mast, and a switch to switch a state of the mast between a fixed state and a released state by the stopper. When the carriage driver drives the traveling carriage, the switch releases the fixing of the stopper and then the lower portion of each of the masts follows the upper portion of each of the masts in the traveling direction of the traveling carriage. When the carriage driver stops the traveling carriage, the stopper fixes the lower portion of each of the masts.

The masts may be provided on the both sides of the elevating platform in the traveling direction of the traveling carriage. The stacker crane may include a lower support base connected to the lower end of each of the masts. The stoppers may be provided on the lower support base. The stopper may move back and forth so as to come into contact with or separate from the floor surface. The stacker crane may be provided with a detector to detect a deviation of an actual stop position of the lower portion of each of the masts fixed by the stopper from a predetermined target stop position. The stacker crane may further include a calibrator to adjust the displacement detected by the detector.

The stacker crane may also be provided with a guide roller to guide the traveling carriage along a rail on a floor surface of a portion of the track at the lower portion of each of the masts. The elevating platform may further include a mast guide moving up and down along the mast. In an example of the stacker crane, the transfer conveyor transfers the article in the direction perpendicular and horizontal to the traveling direction of the traveling carriage. The rigidity of the mast in both vertical and horizontal directions to the traveling direction of the traveling carriage is preferably higher than that of the mast in the traveling direction of the traveling carriage. Further, a suppressor may be provided to reduce and control the oscillation or vibration of the mast.

In a stacker crane according to a preferred embodiment of the present invention, as the mast is suspended from the traveling carriage, the weight of the mast is able to be reduced. As a result, a guide rail need not be installed on the floor within the facility and the facility cost can be reduced. When the article is transferred, the stoppers fix the mast. That allows the stacker crane to transfer the article to a target position while the elevating platform and the transfer conveyor are stopped at the predetermined positions.

The stacker crane may include a plurality of masts and stoppers.

In a preferred embodiment of the present invention, the stacker crane includes the masts on the front and rear sides of the elevating platform in the traveling direction of the traveling carriage, the lower support base connected to the lower end of each of the masts, and the stoppers on the lower support base. The stoppers of this preferred embodiment is able to easily fix the plurality of masts at the lower portion via the lower support base. The stoppers may advance and retreat so as to contact with or separate from the floor surface. The stoppers enable the switch to easily switch a state of the mast between a fixed state and a released state. Preferably, the detector may be provided to detect a deviation of the actual stop position of the lower portion of each of the masts fixed by the stoppers from the predetermined target stop position. The detector is able to easily detect the deviation of the lower portion of each of the masts from the target stop position. As a more preferable example, the calibrator may be provided to adjust the deviation detected by the detector. This calibrator can adjust the deviation of the lower portion of each of the masts, thus the stacker crane of this example enables the deviation of the actual transfer position from the target transfer position to be adjusted easily.

In a preferred embodiment of the present invention, guide rollers are provided at the lower portion of each of the masts to guide the traveling carriage to the guide rail formed on the floor surface of the section where the traveling carriage travels. As the traveling carriage is guided by the rail, the lower portion of each of the masts is prevented from largely deviating from a position below the traveling carriage when traveling on a curve. As a further preferable example, the elevating platform may be provided with mast guides to move up and down along the mast. The mast guides allow the elevating platform to move up and down smoothly. As the transfer conveyor transfers the article in the direction perpendicular and horizontal to the traveling direction of the traveling carriage, the mast preferably has higher rigidity in the horizontal direction than in the traveling direction. Such a mast can support a force generated in the horizontal direction and prevent the transfer direction of the article from deviating from the target position when the article is transferred. The stacker crane may further include a suppressor to suppress the oscillation or vibration of the mast to prevent the vibration from being transmitted to the article.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1A is a diagram viewed from the Y direction, and FIG. 1B is a diagram viewed from the X direction.

FIG. 3A is a diagram in which the guides are applied to the masts having a square cross section, and FIG. 3B is a diagram in which the guides are applied to the masts having a rectangular cross section and increasing the rigidity in the transfer direction.

FIG. 4A illustrates a state in which the article is moving to the load port, and FIG. 4B is a diagram showing a state in which the article has reached the load port.

FIG. 5A is a diagram viewed from the X direction, FIG. 5B is a diagram viewed from the Y direction, and FIG. 5C shows a detection operation when viewed from the Z direction.

FIG. 6A is viewed from the Z direction, and FIG. 6B is a view from the Y direction.

FIG. 7A is a diagram showing the traveling state of the stacker crane, FIG. 7B is a diagram viewed from the X direction, and FIG. 7C is a diagram viewed from the Y direction.

FIG. 8A is a diagram viewed from the Y direction, and FIG. 8B is a diagram viewed from the X direction.

DETAILED DESCRIPTION OF THE PREFERRED EMBODIMENTS

Preferred embodiments of the present invention will be described hereinafter with reference to the drawings. In each of the following figures, a direction is described by using a Cartesian XYZ coordinate system. In this XYZ coordinate system, a vertical direction is indicated as the Z direction, and a horizontal direction is indicated as the X direction and the Y direction. With respect to each of the X, Y and Z directions, a direction indicated by an arrow is expressed as + direction (for example, the +X direction) and the opposite direction is expressed as the −X direction (for example, the −X direction).

Figure 1A:
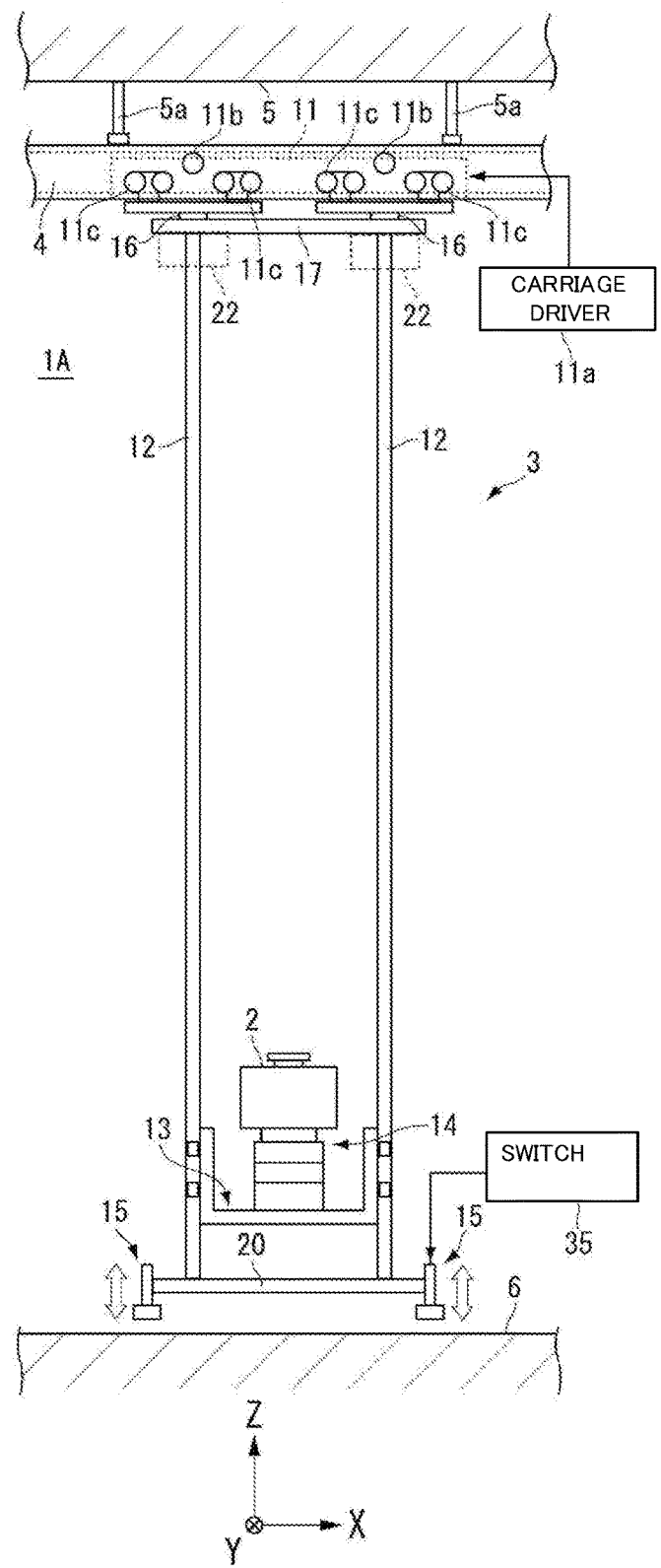
FIGS. 1A and 1B show examples of a transport system to which a stacker crane according to a preferred embodiment of the present invention is applied.
Figure 1B:
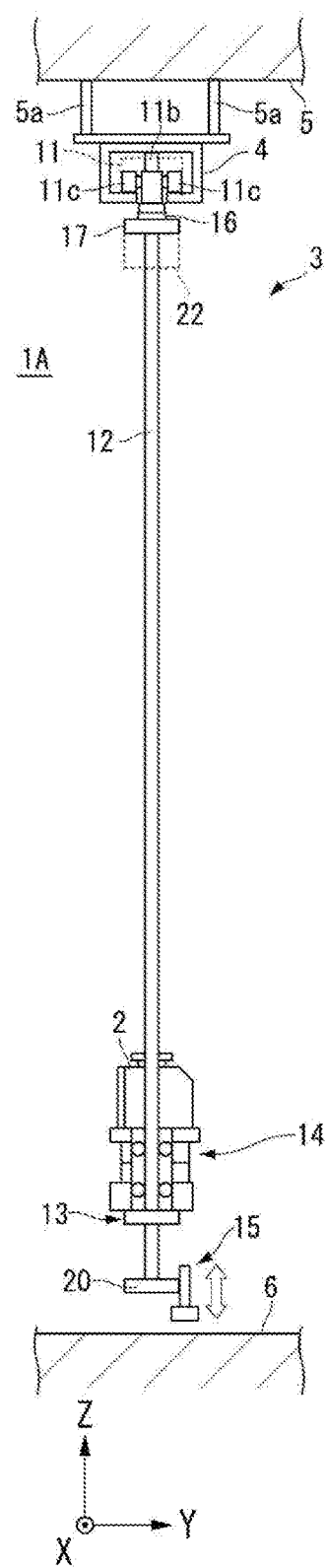

FIGS. 1A and 1B are diagrams showing a transport system to which a stacker crane according to a preferred embodiment of the present invention is applied. Such a transport system 1A is preferably installed, for example, in a semiconductor device fabrication plant and applied to a system which transports a FOUP (Front Opening Unified Pod) containing semiconductor wafers used for semiconductor device manufacture or an article 2 such as a reticle pod containing processing components such as a reticle. Here, the article 2 is described as a FOUP, but not limited to this. The transport system 1A is applicable to facilities other than the semiconductor field, and the article 2 may be a variety of articles handled in the facility where the transport system 1A is installed.

The transport system 1A includes a stacker crane 3 and a track 4. In an example of a preferred embodiment of the present invention, the track 4 includes a traveling rail suspended from a ceiling 5 of the facility with a plurality of rail support members 5a. The stacker crane 3 travels along the track 4 and transfers the article 2 to the transfer destination. For example, the transfer destination or transfer origin of the article 2 includes, but is not limited to, a load port 32a of a processing machine 32 (shown in FIGS. 4A and 4B), a storage shelf 31 arranged in a stocker (automated storage) or on the processing machine (shown later in FIGS. 4A and 4B), or a buffer.

The processing machine includes, for example, an exposure machine, a coater developer, a film forming device, or an etching device and performs various kinds of processing on the semiconductor wafer housed in the article 2. The stocker stores the article 2 transported by the transport system 1A. The buffer includes a side track buffer (STB) or an under track buffer (UTB) which are installed near the processing machine. An overhead traveling vehicle of the transport system 1A (not shown) temporarily stores the article 2 in the buffer. The overhead traveling vehicle includes, for example, an OHT (Overhead Hoist Transport) or an OHV (Overhead Hoist Vehicle).

The stacker crane 3 includes a traveling carriage 11, a mast 12, an elevating platform 13, a transfer conveyor 14 and stoppers 15. The traveling carriage 11 travels along the track 4. The traveling direction of the traveling carriage 11 is the direction parallel or substantially parallel to the track 4 (the X direction in FIGS. 1A and 1B). The traveling carriage 11 includes, for example, a carriage driver 11a such as an electric motor, driving wheels 11*b*, driven wheels 11*c*, a decelerator (not shown) and an encoder (not shown). The driving wheels 11*b* are attached so as to be pressed against an inside upper surface of the track 4 by an elastic member (not shown) such as a spring and connected to the output shaft of the electric motor (carriage driver 11*a*) through the decelerator. The rotation of the output shaft of the electric motor is transmitted through the decelerator to the driving wheels 11*b*, and then the traveling carriage 11 travels by the rotation of the driving wheels 11*b*. A caster is attached to each driven wheel 11*c* so as to be rotatable around the caster axis in the vertical direction (the Z direction) and also be in contact with the inner bottom surface of the track 4. The encoder detects the rotation frequency of the output shaft of the electric motor and outputs the detection results to a controller (not shown). The controller controls the rotation frequency of the electric motor based on the results of the encoder and determines the speed and the stop position of the traveling carriage 11. The stop position of the traveling carriage 11 may be set by detecting an index plate installed in advance along the track 4. Besides the electric motor, a linear motor may be used as the carriage driver 11*a*.

The stacker crane 3 includes a rotary shaft 16 provided below the traveling carriage 11 and an upper support base 17 attached to the lower portion of the rotary shaft 16. The masts 12 are attached to the upper support base 17 and suspended from the traveling carriage 11. The masts 12 are provided on both sides (a +X direction <a plus X-direction>, a −X direction <a minus X-direction>) of the traveling direction of the traveling carriage (the X direction). The masts 12 may be attached to the upper support base 17, for example, with a fastening member such as a bolt and nut or by welding.

The masts 12 are connected to a lower support base 20 at their lower ends. The lower support base 20 is connected to a +x-side mast 12 and −x-side mast 12 so that the distance between each of the masts at the lower support base 20 is equal to the distance between each of the masts at the upper support base 17. Thus the distance between both of the masts 12 is equal or substantially equal at both upper and lower ends. The lower support base 20 has, for example, a plate shape. The front and rear masts 12 are connected to the front and rear portions of the elevating platform in the traveling direction of the traveling carriage. The elevating platform 13 will be described later in detail. The lower support base 20 including stoppers is structured to move back and forth so as to contact with or separate from the floor surface 6. The stoppers 15 will be described later in detail.

When the traveling carriage 11 accelerates in the traveling direction (for example, when the traveling carriage starts to travel from a stop state), the lower portion of each of the masts 12 cannot follow the lower portion of the traveling carriage 11 due to an inertia force, which causes a delay. The delay of the lower portion of each of the masts 12 can be solved by the following method. For example, the carriage driver 11*a* temporarily decelerates the traveling carriage 11 or repeats to decelerate the traveling carriage 11 several times during acceleration or traveling.

When the traveling carriage 11 decelerates toward the traveling direction (for example, when the traveling carriage stops from a traveling state), the lower portion of each of the masts 12 moves ahead of the lower portion of the traveling carriage 11 due to an inertia force. This problem is caused by moving the lower portion of each of the masts 12 ahead. The carriage driver 11*a* can solve this problem by temporarily increasing the acceleration of the traveling carriage 11 or repeating such an increase in the acceleration over a plurality of times before or during slowing down to stop the traveling carriage 11.

Figure 2:
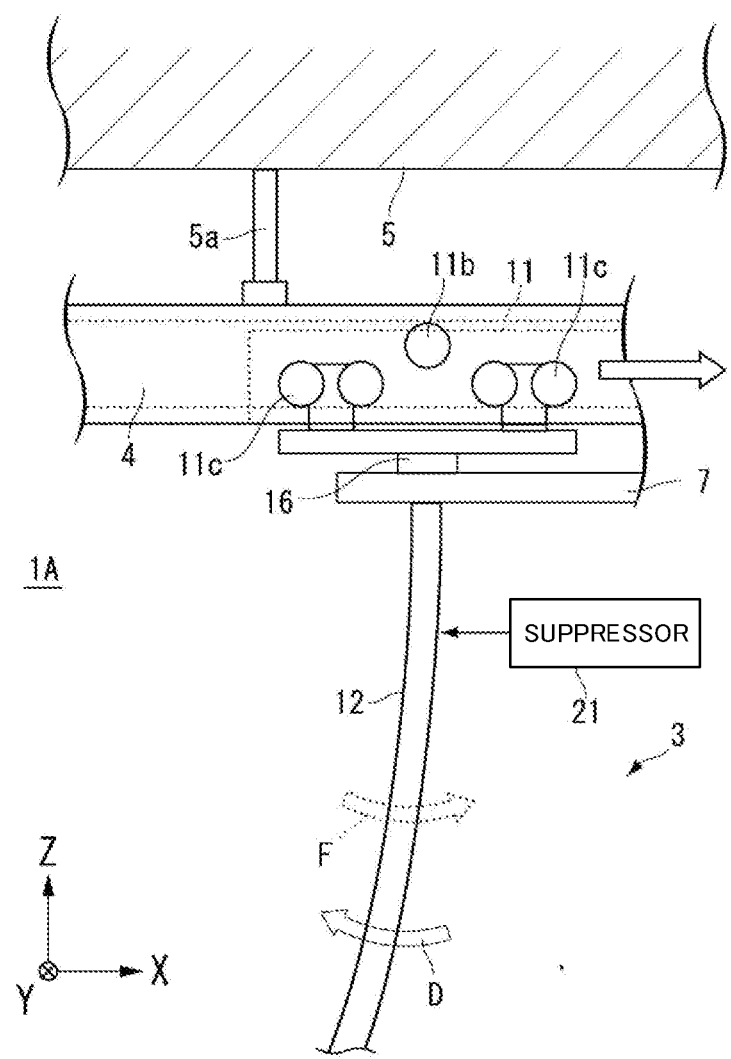
FIG. 2 is a diagram showing an example of applying a suppressor to the stacker crane of FIGS. 1A and 1B.

In this preferred embodiment, the stacker crane 3 includes a suppressor to reduce the oscillation or vibration of the mast 12. FIG. 2 is a diagram showing an example of the suppressor. As FIG. 2 shows, the suppressor such as an air damper or an oil damper, applies a force to the mast in the direction (indicated by the symbol F) opposite to the movement of the mast 12 (indicated by the symbol D). For another example, the suppressor 21 includes, but is not limited to, an elastic member such as a coil spring or a mechanism such as an actuator to impart a force to the mast 12.

Returning to the description of FIGS. 1A and 1B, the elevating platform 13 moves up and down along the masts 12. The elevating platform 13 is placed between the +X side mast 12 and the −X side mast 12. The elevating platform 13 is suspended from the upper support base 17 with hoist cables (not shown) such as wires. The upper support base 17 is provided with an elevator driver 22 to wind the hoist cables up and down. The elevator driver 22 winds the hoist cables down and then the elevating platform 13 is guided to descend along the masts 12. The elevator driver 22 winds the hoist cable up and then the elevating platform 13 is guided to ascend along the masts 12. The transfer conveyor 14 is provided on the elevating platform 13.

Figure 3A:
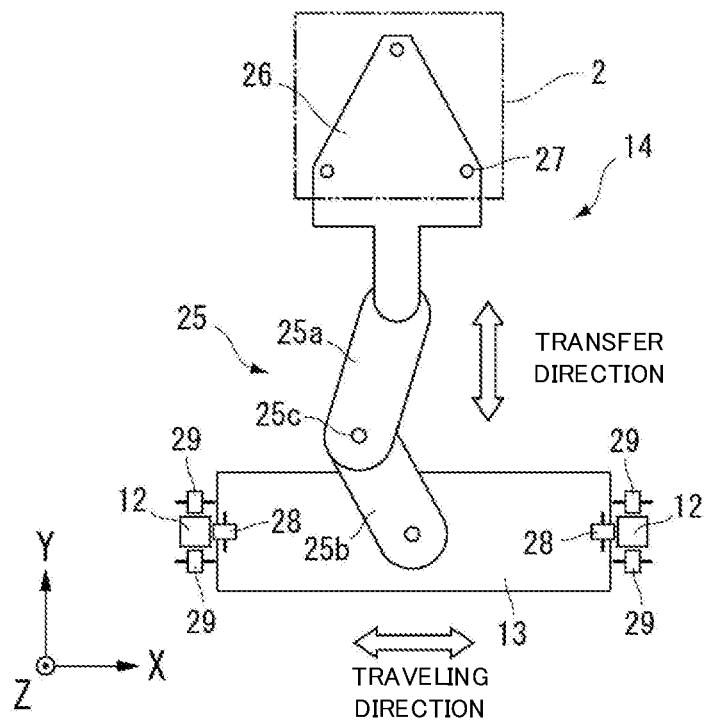
FIGS. 3A and 3B show examples of masts and guides.
Figure 3B:
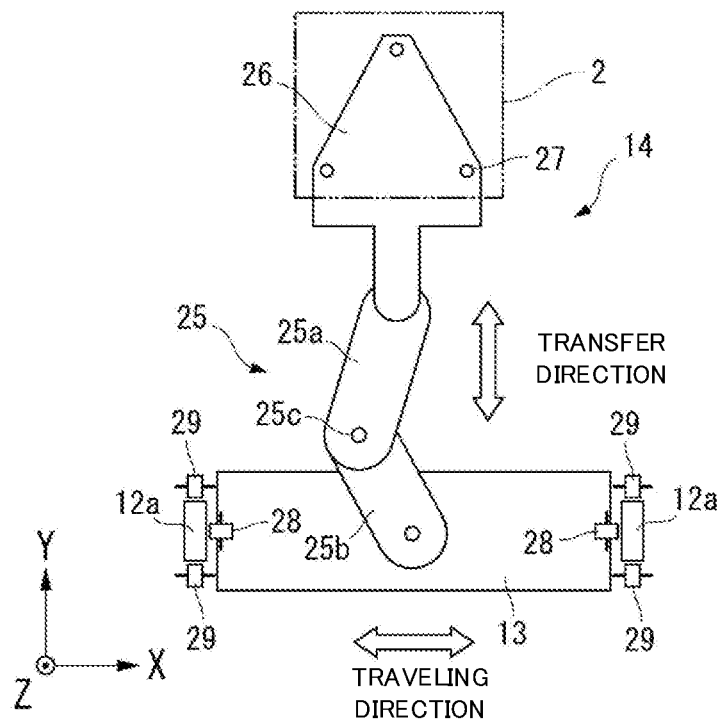

FIGS. 3A and 3B show examples of the masts 12, the mast guides 28, and the mast guides 29. FIG. 3A is a diagram in which a pair of the mast guides 28 and a pair of the mast guides 29 are applied to the masts 12 having a square cross section. FIG. 3B is a diagram in which a pair of the mast guides 28 and a pair of the mast guides 29 are applied to the masts 12*a* having a rectangular cross section to increase the rigidity in the transfer direction. The transfer conveyor 14 includes an arm 25 and a holder 26. The arm 25 includes an arm 25*a* and an arm 25*b* that are linked to each other with a joint 25*c*. The arm 25 expands and contracts in the horizontal direction including the Y direction by folding the arm 25*a* and the arm 25*b* at the joint 25*c*. The arm 25 is connected to the elevating platform 13 at the proximal end and to the holder 26 at the distal end. The holder 26 includes a plurality of (for example, three) pins 27 (for example, kinematic pins). The pins 27 respectively enter into a plurality of radial grooves located on the bottom surface of the article 2. In this way, the pins 27 determine an accurate position of the article 2 on the holder 26.

The transfer conveyor 14 extends the arm 25 towards the direction of the transfer origin and places the holder 26 under the bottom of the article 2 and then receives the article 2 from the transfer origin. The elevating platform 13 moves up, and then the transfer conveyor 14 scoops up the article 2 with the holder 26. The transfer conveyor 14 contracts the arm 25 while holding the article 2 on the holder 26 and then places the holder 26 on the elevating platform 13. The following describes how the transfer conveyor 14 transfers the article 2 to the transfer destination. The transfer conveyor 14 determines a position toward the transfer destination and extends the arm 25 and places the article 2 on the holder 26 above the transfer destination. The elevating platform 13 moves down, and then the transfer conveyor 14 transfers the article 2 from the holder 26 to the transfer destination.

The transfer conveyor 14 shown in FIGS. 3A and 3B is one example and may have other structures. For example, the transfer conveyor may hold the article 2 by firmly gripping a flange which is placed on the upper portion of the article 2 or by holding the sides of the article 2. The transfer conveyor 14 may include, but is not limited to the arm 25. For example, an articulated robotics arm may be used.

A direction which the article 2 moves to when the transfer conveyor 14 transfers the article 2 is hereinafter referred to as a transfer direction accordingly. In this description, the expression "transfer direction" means a direction that the arm 25 extends and contracts to/from (the Y direction) and also a direction perpendicular and horizontal to the traveling direction of the traveling carriage 11 (the X direction). As shown in FIG. 3A, the elevating platform 13 includes the mast guides 28 and the mast guides 29 to guide the elevating platform 13 along the masts 12. Each of the mast guides 28 and the mast guides 29, for example, includes a guide roller.

The elevating platform 13 includes the mast guides 28 on its upper surface. Each of the mast guides 28 guides the +x side mast 12 and the −x side mast 12 in the traveling direction of the traveling carriage. The mast guides 28 regulate the moving path of the elevating platform 13 and the masts 12 in the X direction. Moreover, the mast guides 28 regulate the each position of the masts 12 on the +X side and the −X side with respect to the elevating platform 13. The mast guides 28 then determine the relative position of each of the masts 12 on the +X and −X sides in the X direction.

The mast guides 29 are arranged so as to pinch each of the masts 12 on the +X and −X sides from the perpendicular direction and the horizontal direction (the transfer direction) to the traveling direction of the traveling carriage 11. The mast guide enables elevating platform 13 smoothly to move up and down. This allows the mast guide 28 to prevents interference between the mast 12 and the elevating platform 13. The mast guides 29 also prevent the elevating platform 13 from shifting to the transfer direction from the positions of the masts 12 and detaching from the moving path along each of the masts 12. In the preferred example, the mast guides 28 may preferably pinch each of the +X side mast 12 and the −X side mast 12 from both sides. The mast guides 28 and the mast guides 29 prevent the elevating platform 13 from deviating from the moving path along each of the masts 12 as the mast guide 28 and a pair of the mast guides 29 surround each of the masts 12.

A mast 12a in FIG. 3B and the mast 12 in FIG. 3A have different shapes. The mast 12a has a higher rigidity in the perpendicular direction to the traveling direction of the traveling carriage 11 and the horizontal direction (the transfer direction, the Y direction) than in the traveling direction of the traveling carriage 11 (the X direction). Here, the rigidity in the transfer direction is the rigidity to a bending moment around an axis parallel to the X direction. The rigidity in the traveling direction is the rigidity to the bending moment around an axis parallel to the Y direction. In FIG. 3B, the dimension of the mast 12 in the Y direction is longer than that in the X direction, and the rigidity in the transfer direction is higher than that in the traveling direction.

The holder 26 holds the article 2 and the arm 25 is extended, and then the transfer conveyor 14 receives a moment around an axis parallel to the X direction. The moment is transmitted to the mast 12 via the elevating platform 13. As shown in FIG. 3B, as the mast 12a in the present preferred embodiment has higher rigidity in the transfer direction than in the traveling direction, the weight of the mast 12a is able to be decreased by reducing the rigidity in the traveling direction, and the rigidity in the transfer direction enables the mast 12a to withstand the bending moment generated at the time of transferring the article.

Returning to the description of FIGS. 1A and 1B, the weight of the stacker crane 3 supported by the ceiling is larger than the weight supported by the floor 6, when the traveling carriage 11 travels. For example, the stacker crane 3 is not in contact with the floor 6 (in a state of being lifted from the floor 6) when the traveling carriage 11 travels. The total weight of the stacker crane 3 is supported by the track 4 and the weight supported by the floor surface 6 is approximately zero. In the present preferred embodiment, the carriage driver 11 disposed at the upper side of the upper support unit including the upper support base 17 (for example, the carriage driver 11a) mainly supplies a driving force for the traveling carriage 11 to travel. As the lower support including the lower support base 20 is not provided with the carriage driver to provide the driving force, the lower support base 20 moves by following the upper support base 17.

The stoppers 15 fix the masts 12 to a stationary object. The stationary object includes, for example, the floor surface 6, the storage shelf 31 (such as the stocker or the buffer) or the processing machine 32. In this preferred embodiment, the stoppers 15 fix the masts to the floor 6, and then the transfer conveyor 14 transfers the article. The stoppers 15 include anchors on the lower support base 20 at the both sides of the traveling direction (the X direction). The stoppers 15 are capable of advancing or retreating (ascending or descending) above the floor surface 6. The stacker crane 3 also includes the switch 35 to switch the state of the mast between a fixed state and a released state. The switch 35 is attached on the lower support base 20, for example. Having a stopper driver (for example, electric motor or cylinder device), the switch 35 is capable of switching between the fixed state and the released state by moving forward or backward the stoppers 15 by the stopper driver. The stoppers 15 may fix the masts 12 when parking the traveling carriage 11.

When the carriage driver 11a drives the traveling carriage 11, the switch 35 controls the stoppers 15 to release the fixation of the stoppers and enables the lower portion of each of the masts to follow the upper portion of each of the masts 12 in the travelling direction. When the carriage driver 11a stops the traveling carriage 11, the switch 35 can control the stoppers 15 to fix the masts 12 (lower portion of each of the masts 12) after the lower portion of each of the masts 12 stops following the upper portion of each of the masts 12 (after a predetermined time has passed from the stop of the traveling carriage 11) or immediately after the traveling carriage 11 stops. The stoppers 15 fix the masts 12 (lower support base 20) and then the relative position between the transfer destination and the elevating platform 13 is determined. The fixing of the masts 12 by the stoppers 15 is the preparation for position adjustment with respect to the transfer destination of the article 2, which will be explained later.

When the transfer conveyor 14 transfers the article, the switch 35 enables the stoppers 15 to advance to the floor 6 and contact with the floor surface 6 to fix the lower support base 20 to the floor surface 6. The masts 12 are fixed to the floor 6 together with the lower support base 20 by the stoppers 15 as the lower end of each of the masts 12 is connected to the lower support base 20. Thus, the lower portion of each of the masts 12 and the lower support base 20 are fixed to the stationary object (such as the floor surface 6 or the parked traveling carriage 11).

Figure 4A:
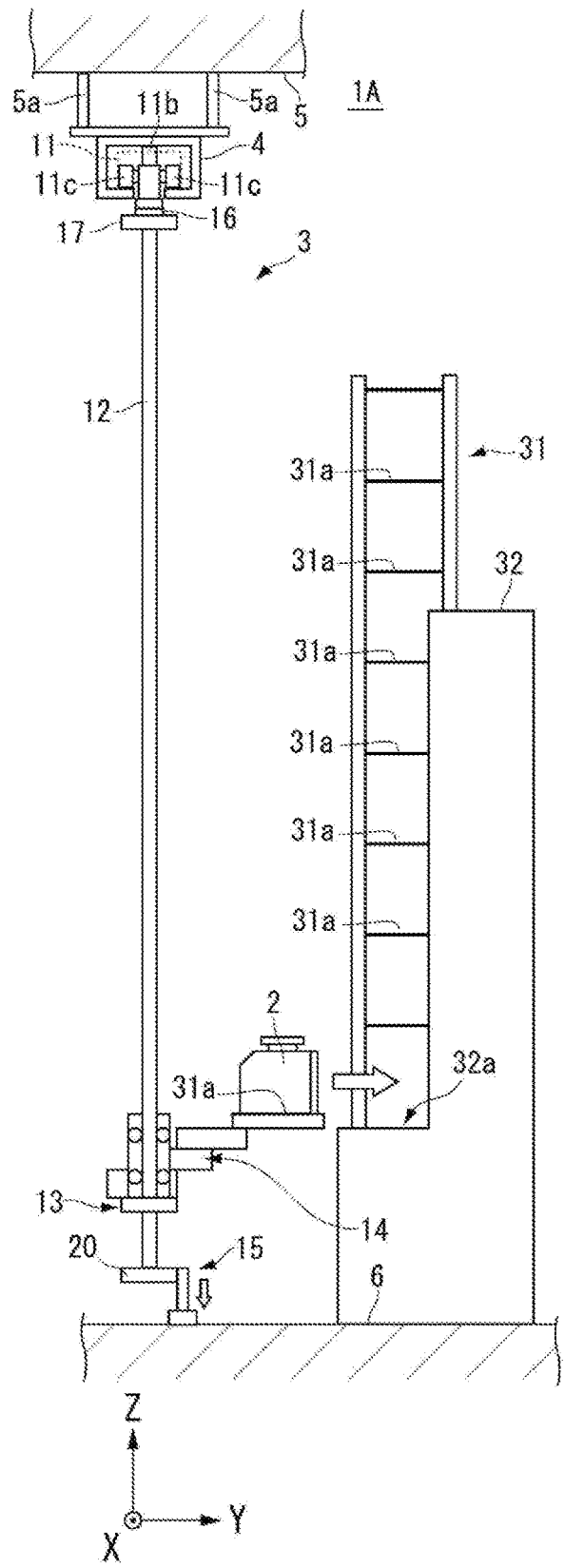
FIGS. 4A and 4B show examples of an article transfer operation.
Figure 4B:
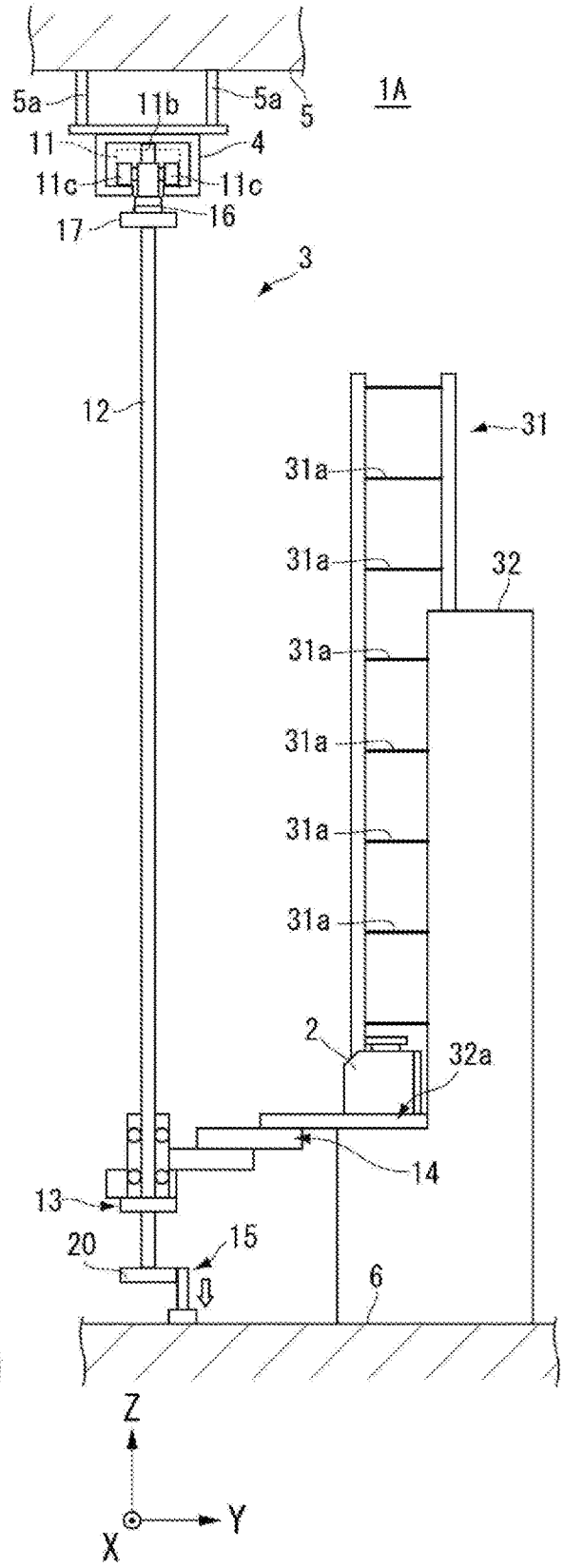

FIGS. 4A and 4B show one example of transfer operation of the article 2, FIG. 4A shows a state in which the article is in the process of being transferred to the load port, and FIG. 4B shows a diagram in which the article has reached the load port. The transport system 1A of this preferred embodiment includes a storage shelf 31 to store the article 2. The storage shelves 31 are aligned, for example, in the X direction with respect to the processing machine 32. The storage shelf 31 includes a plurality of shelf plates 31a arranged in the vertical direction. The transfer conveyor 14 of the stacker crane 3 can receive and deliver the article 2 from/to each of the plurality of the shelf plates 31a.

The switch 35 moves the stoppers 15 downward to contact with the floor surface 6 and fix the lower support base 20 and the lower portion of each of the masts 12 to the traveling carriage 11 or the floor 6, and the transfer conveyor 14 transfers the article 2 to the shelf plate 31a (in the fixed state). In addition, the switch 35 causes the stoppers 15 to fix the lower support base 20 and the lower portion of each of the masts 12 to the traveling carriage 11 or the floor 6, the transfer conveyor 14 receives the article 2 from the shelf plate 31a (in the fixed state). The transport system 1A may not include the storage shelf 31, and may transfer the article 2 to some storage place other than the storage shelf 31. After the article 2 has been transferred completely, the switch 35 moves the stoppers 15 upward and away from the floor surface 6, and the traveling carriage 11 enables to travel freely (in the released state).

As shown in FIGS. 4A and 4B, the lower support base 20 and the lower portion of each of the masts 12 are fixed to the floor 6, (the traveling carriage 11, or the transfer destination) by the stoppers 15, and then the transfer conveyor 14 approaches the transfer destination and transfers (or receive) the article 2 to (or from) the transfer destination. In addition, the transfer conveyor 14 may transfer the article 2 from/to the load port 32a of the processing machine 32 other than from/to the storage shelf 31. For example, the transfer conveyor 14 receives the article 2 from the storage shelf 31 and transfers the article 2 to the load port 32a. The transfer conveyor 14 also receives the article 2 from the load port 32a and transfers the article 2 to the storage shelf 31.

For example, the switch 35 moves the stoppers 15 downward to contact with the floor surface 6 and fix the lower support base 20 and the lower portion of each of the masts 12 to the floor surface 6 (or the traveling carriage 11) in the same way described above, and the transfer conveyor 14 transfers the article 2 from/to the load port 32a. In another example, the transfer conveyor 14 may transfer the article 2 from/to the stocker (automated storage) or the buffer (each of them not shown) as is the case with the load port 32a. The lower support base 20 and the lower portion of each of the masts 12 are fixed to the floor surface 6 (or the travelling carriage 11) in a manner similar to that described above, and then the transfer conveyor 14 transfers the article 2 from/to the stocker.

Figure 5A:
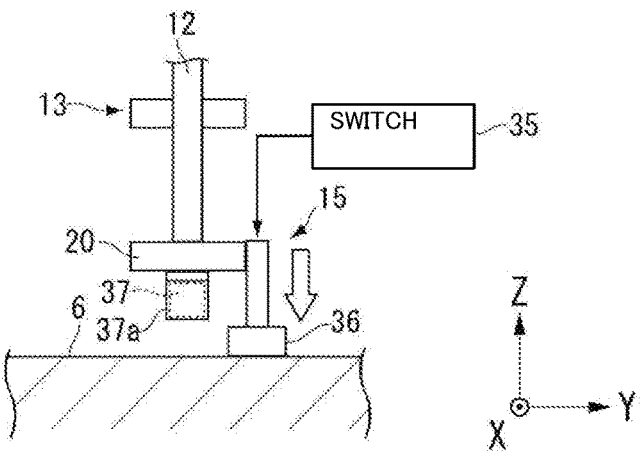
FIGS. 5A to 5C are diagrams showing an example of stoppers and a detector.
Figure 5B:
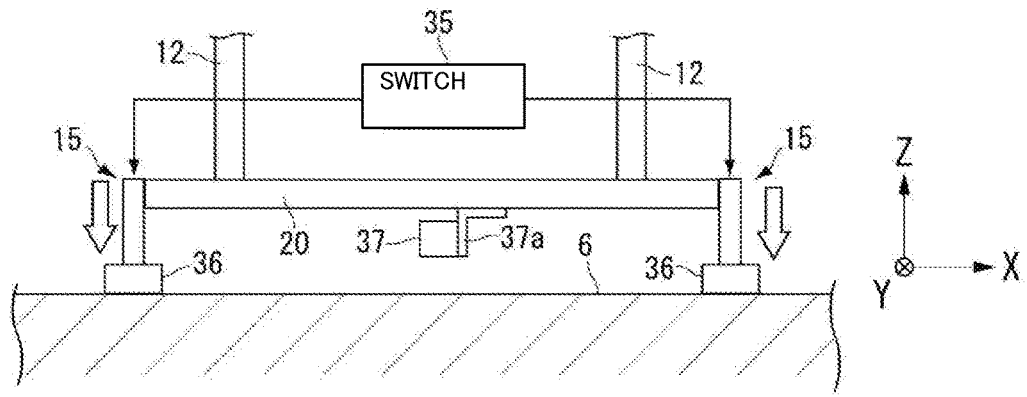
Figure 5C:
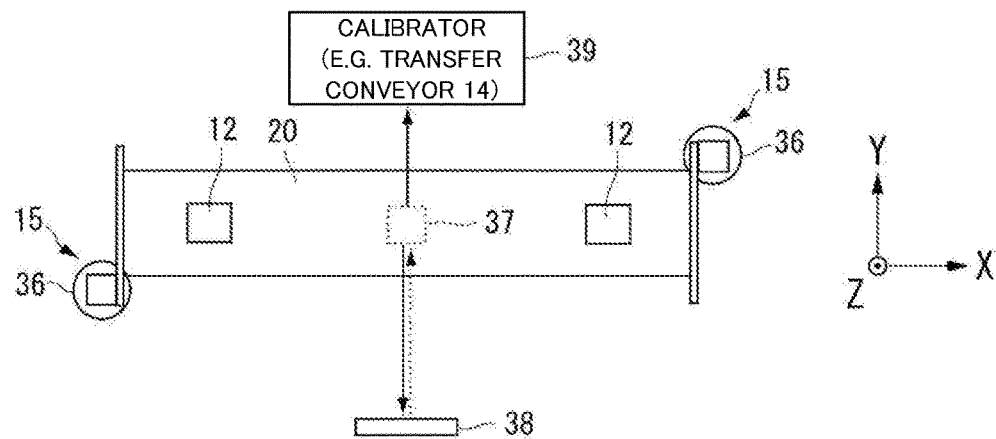

FIGS. 5A to 5C show one example of the stoppers 15 and a detector 37, FIG. 5A is a diagram viewed from the X direction, FIG. 5B is a diagram viewed from the Y direction, and FIG. 5C is a diagram viewed from the Z direction and showing a detection operation. The stoppers 15 as shown in FIGS. 5A and 5B include outriggers 36 to elevate and lower from/to a position of the lower support base 20 by the switch 35. The outriggers 36 are brought into contact with the floor surface 6 to restrict the movement of the lower support base 20 toward the horizontal direction and are movably attached to the lower support base 20. The switch 35 advances and retreats the outriggers 36 from/to the floor surface 6. The switch 35 is, for example, controlled by a controller of the stacker crane 3 (not shown). This controller manages to advance and retreat the outriggers 36 at the timing when the controller specifies. Note that, the structure of the stoppers 15 is not limited to the structure shown in FIGS. 5A to 5C and other structures may be adopted.

Moreover, the stacker crane 3 may include the detector 37 as shown in FIGS. 5A to 5C. A distance sensor may be used as an example of the detector 37. In the above described drawings, the distance sensor is attached to the undersurface and also in a substantially center portion of the lower support base 20 in the traveling direction via a stay 37a, but the detector 37 can be attached to any positions. In addition, as shown in FIG. 5C, a mirror reflector 38 is placed at a position below the transfer destination of the article 2. The mirror reflector 38 is disposed on a side surface of the processing machine 32 (refer to FIGS. 4A and 4B) and also at a position below the load port 32a.

In this example, a light emitter of the detector 37 emits the detected light such as laser light to the mirror reflector 38, the mirror reflector 38 reflects the detected light to the detector 37, and then a light receiver of the detector 37 detects the reflected light. A distance calculator of the detector 37 measures a distance between the detector 37 (lower support base 20) and the mirror reflector 38. The measured distance is compared with the target distance recorded in a memory of the controller (not shown) of the stacker crane 3 and then the deviation amount in the Y direction is calculated. A calibrator 39 adjusts the position deviating from the target position by the distance calculated by the detector 37 or the controller of the stacker crane 3. The example of the transfer conveyor 14 used by the calibrator 39 is explained below.

In the present preferred embodiment, the stoppers 15 fix the lower support base 20 and the lower portion of each of the masts 12 after the traveling carriage 11 stops at the target position. Such operation causes the lower support base 20 and the lower portion of each of the masts 12 to deviate from the target stop position. As mentioned above, the deviation amount of the traveling direction (the X direction deviation) is caused by the lower portion of each of the masts 12 and the lower support base 20. Thus, the deviation amount can be reduced by using a drive source, which controls the acceleration and deceleration of the traveling carriage 11 during traveling, when the traveling carriage slows down to stop. On the other hand, the deviation amount of the transfer direction (the Y direction deviation) cannot be reduced because of the lack of adjustment by such a drive source. The Y direction deviation is expected to be generated as the masts 12 are swinging in the transfer direction. This allows that the deviation amount from the target stop position is likely to be larger in the transfer direction (the Y direction) than in the traveling direction (the X direction).

The detector 37 detects a deviation in the transfer direction, and the detected deviation is adjusted by the calibrator 39. This allows the article to be transferred to the accurate position. The calibrator 39 using the transfer conveyor 14 is explained as an example. The transfer conveyor 14 extends the arm 25 up to the predetermined distance (the stroke length) (shown in FIGS. 3A and 3B). As mentioned above, since the deviation occurs in the transfer direction, the detector 37 detects the deviation amount and sends the detected deviation amount to a controller of the transfer conveyor 14. The controller of the transfer conveyor 14 adjusts the stroke length according to the detected deviation amount. In this way, the calibrator 39 using the transfer conveyor 14 allows the article 2 to be accurately transferred to the transfer destination (for example, the storage shelf 31 in FIG. 4A).

In another example of a preferred embodiment of the present invention, the detector 37 may measure not only the deviation amount in the transfer direction but also the deviation amount in the traveling direction. The detector 37 emits the detected light toward the mirror reflector 38 provided in the traveling direction and detects the light reflected by the mirror reflector 38. The deviation amount in the traveling direction is calculated based on the information derived from the detected data. The detector 37 to measure the deviation amount in this example is not limited to the distance sensor, but includes an image sensor mounted on the lower support base 20. A mark directed to the position of the processing machine 31 may be provided on the floor 6. The detector 37 measures the deviation either one or both of the traveling and transfer direction to the target position by the image data captured by the image sensor.

In this example, a transfer conveyor 14 is adopted as the calibrator 39, but it is not limited to, and the calibrator 39 may include a structure that is mounted on the lower support base 20 and moves the transfer conveyor 14 in both the X and Y directions. Such a structure may also have only one direction movement, which is in either the X or Y direction. The combination of the two structures enables the transfer conveyor 14 to move in both directions.

Figure 6A:
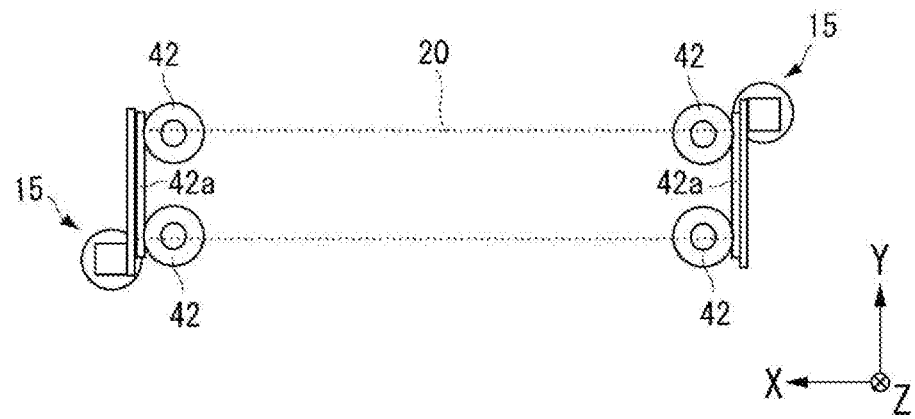
FIGS. 6A and 6B show examples in which guide rollers are applied.
Figure 6B:
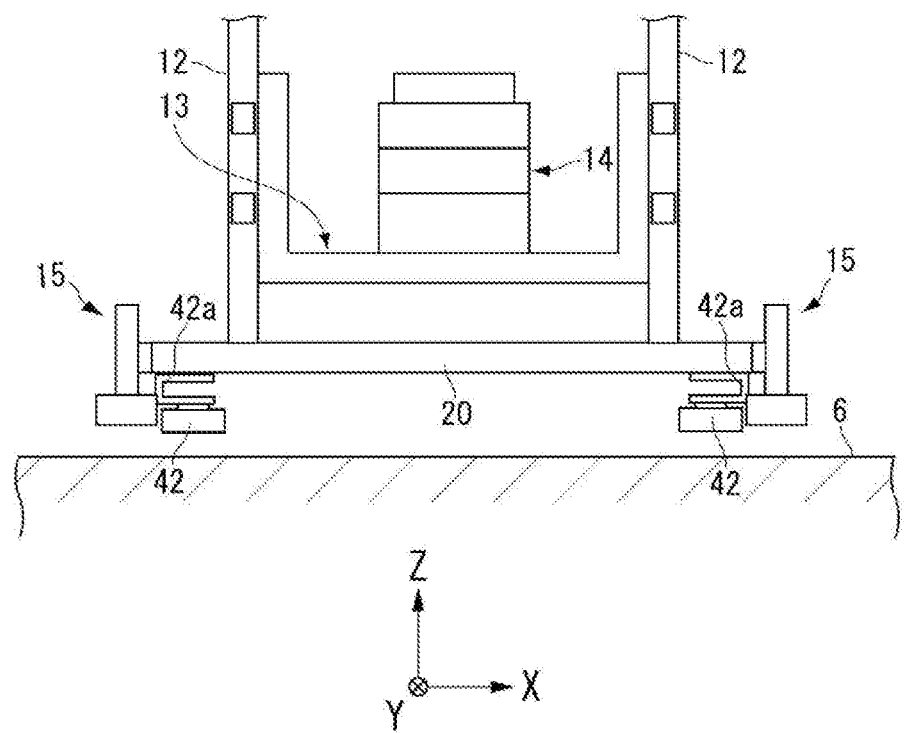

FIGS. 6A and 6B show one example where guide rollers 42 are applied to the stacker crane, FIG. 6A is a diagram viewed from the Z direction, and FIG. 6B is a diagram viewed from the Y direction. As shown in FIGS. 6A and 6B, in the present preferred embodiment of the present invention, a plurality of guide rollers 42 are provided on the undersurface of the lower support base 20. Four guide rollers 42 are rotatable, for example. The guide rollers 42 are held to one bracket 42a in pairs. The two brackets 42a are attached to the lower support base 20. Each guide roller 42 is rotatable around an axis in the vertical direction (the Z direction) and is placed at a substantially same height as the other guide roller 42 and also at an interval so as to interpose a guide rail 41 (mentioned later.) The arrangement and the number of guide rollers 42 in the present preferred embodiment are just one example and are not limited or restricted.

Figure 7A:
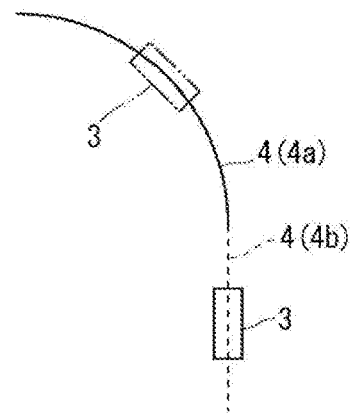
FIGS. 7A to 7C are diagrams showing an example of using a guide rail.
Figure 7B:
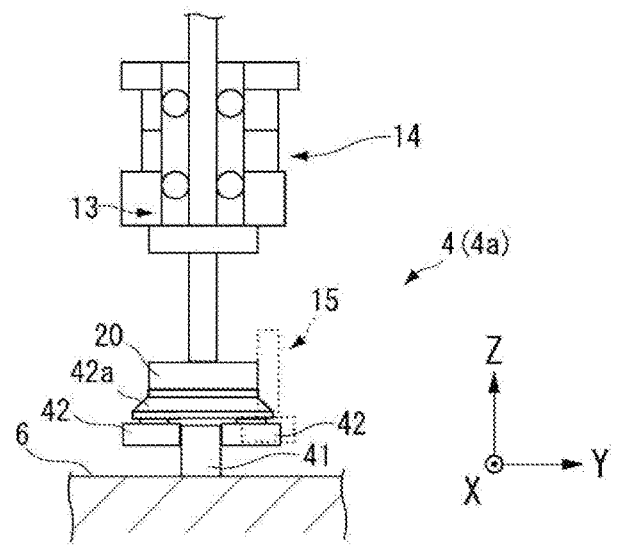
Figure 7C:
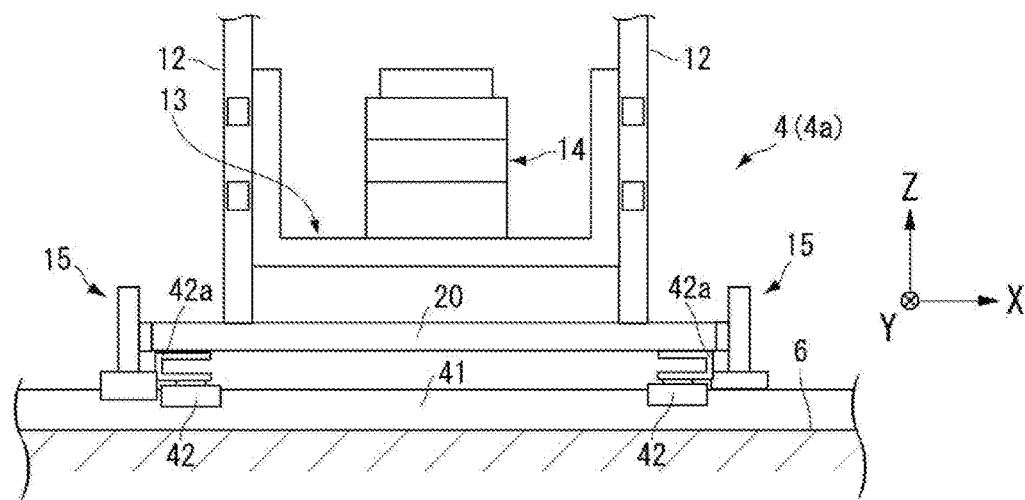

FIGS. 7A to 7C show one example using the guide rail 41, FIG. 7A is a diagram illustrating the travel state of the stacker crane 3, FIG. 7B shows a diagram viewed from the X direction, and FIG. 7C shows a diagram viewed from the Y direction. In the transport system of the present preferred embodiment, the track 4 may include zones 4a and 4b, for example. The zone 4a is curved and the zone 4b is linear, for example. As shown in FIGS. 7B and 7C, the guide rail 41 is installed along the curved zone 4a on the floor 6 but not along the linear zone 4b on the floor 6. In this way, the guide rail 41 may be installed along with a certain zone on the floor 6 under the track 4.

In examples shown in FIGS. 7B and 7C, the lower support base 20 includes the guide rollers 42 which are guided by the guide rail 41. The guide rollers 42 are disposed to pinch the guide rail 41 in the transfer direction (the Y direction). Each guide roller 42 rotates in contact with the guide rail 41. A friction force between the guide rollers 42 and the guide rail 41 is, for example, set to be as small as it can be and ignoring the friction force which can support the weight of the stacker crane 3, and thus, a substantial amount of the total weight of the stacker crane 3 is still supported by the track 4.

When the stacker crane 3 travels along the curved zone 4a, the centrifugal force is applied to the masts 12 in an direction of the curve, which is perpendicular and horizontal to the traveling direction while the stacker crane 3 travels along the curve zone 4a. Such centrifugal force acts on the masts 12 as the bending moment in the transfer direction (perpendicular direction to the traveling direction and also horizontal direction). As shown in FIGS. 7B and 7C, the guide rollers 42 guide the stacker crane 3 along the guide rail 41. At least a portion of such centrifugal force acting on the guide rail 41 is received via the guide rollers 42. As a result, the moment acted on the masts 12 is able to be reduced. In this preferred embodiment, the weight of the stacker crane 3 becomes lighter as the rigidity required for the masts 12 or the connector between the masts 12 and the upper support base decreases.

In the present preferred embodiment, the linear zone 4b does not contain the guide rail 41. Since the stacker crane 3 does not come into contact with the floor 6, the stacker crane 3 is fully supported by the track 4. The stacker crane 3 may not come into contact with the floor 6 in all zones of the track 4 or a portion of zones of the track 4 (zone 4b). The guide rail 41 may also be installed in the linear zone 4b as shown in FIGS. 7B and 7C.

Additionally, FIGS. 7A to 7C illustrate a structure where the guide rollers 42 guide the stacker crane 3 by rolling along the guide rail 41 which is installed on the floor 6, but is not limited to this structure. For example, a portion of the masts 12 or the lower support base 20 connected to the lower ends of the masts 12 may be guided by the guide rail. Moreover, a guide such as the guide rail 41 may be, for example, suspended from the ceiling 5 or provided on a portion of the processing machine installed on the floor 6, as well as being installed on the floor 6.

Figure 8A:
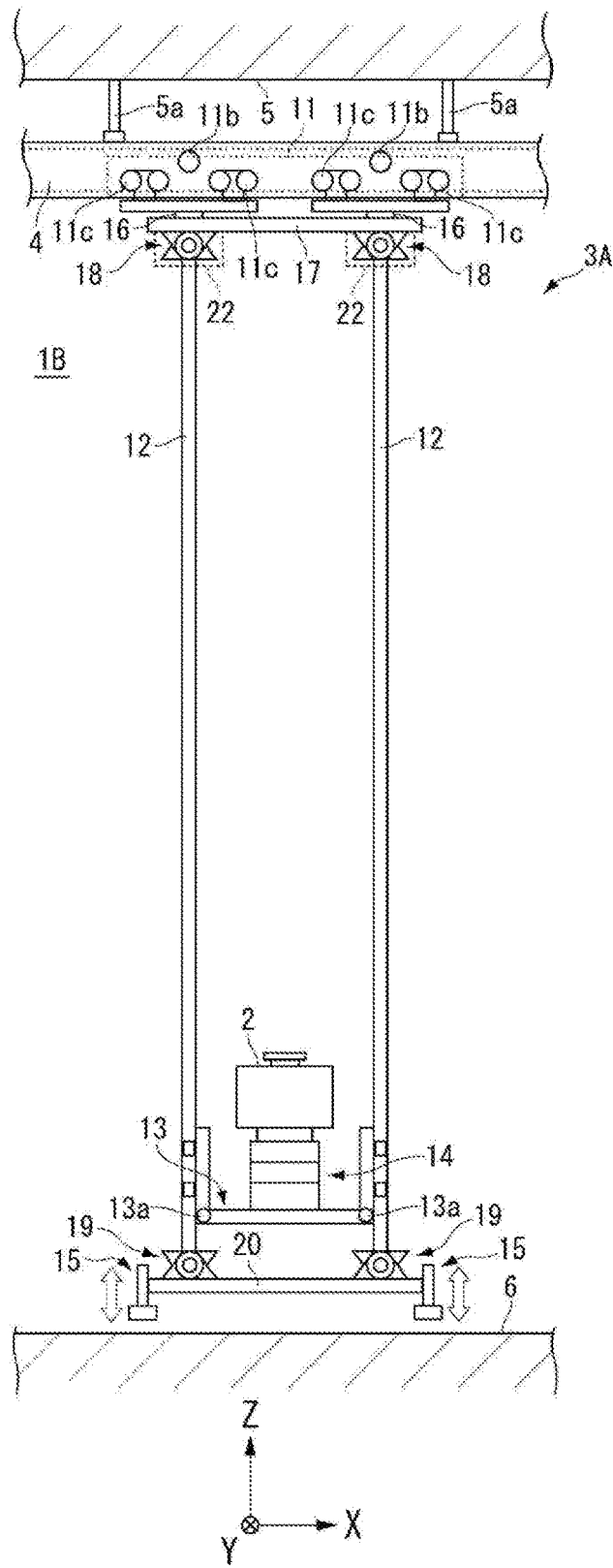
FIGS. 8A and 8B show examples of the transport system to which the stacker crane according to another preferred embodiment of the present invention is applied.
Figure 8B:
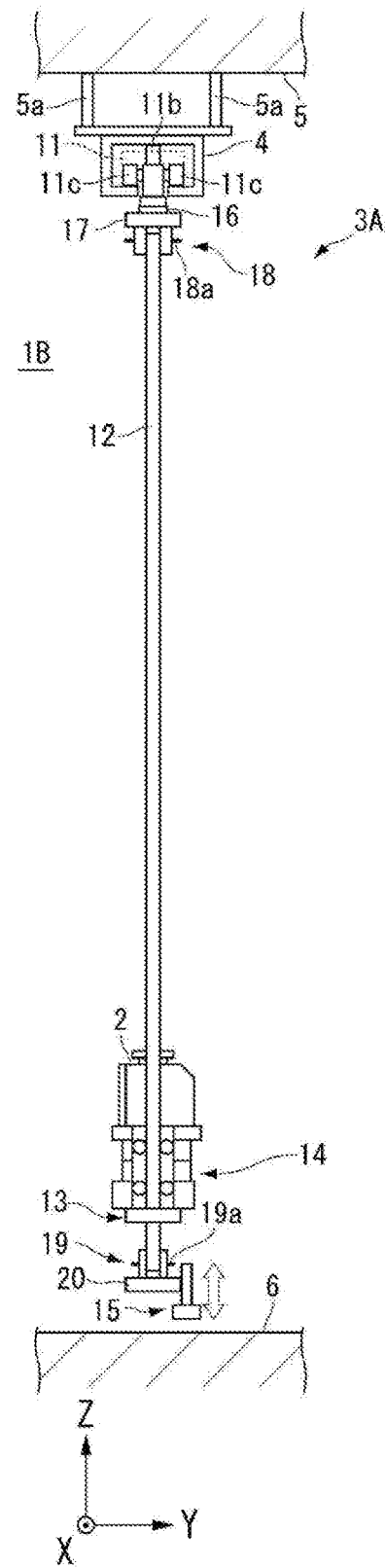

FIGS. 8A and 8B show one example of the transport system 1B using the stacker crane 3A according to another preferred embodiment of the present invention. FIG. 8A is a diagram viewed from the Y direction, and FIG. 8B is a diagram viewed from the X direction. In the present preferred embodiment, the same reference signs are given to the components similar to that in the preferred embodiment which is previously described, and explanation thereof is omitted or simplified. Additionally, the switch 35 shown in FIGS. 1A and 1B is not shown in FIGS. 8A and 8B.

In the stacker crane 3A shown in FIGS. 8A and 8B, the masts 12 and the upper support base 17 are connected by connectors 18. Each of the connectors 18 includes, for example, a hinge and has an axis 18a (refer to FIG. 8B) in the perpendicular direction to the travel direction of the traveling carriage 11 (the X direction) and also the horizontal direction (the Y direction). The connector 18 does not substantially transmit the moment around the axis 18a except for friction. The traveling carriage 11 supports the masts 12 with the connectors 18, which are rotatable (freely rotatable) around the axes 18a.

In addition, the connectors 18 receive a moment around the axes 18a in two directions (the X direction, the Z direction) perpendicular to the axes 18a. The mechanism of the connectors 18 prevents the masts 12, which are arranged in the mast longitudinal direction and the vertical direction (the Z direction), from inclining to the lateral side (the −Y direction or the +Y direction) of the track 4 and from being twisted around the vertical direction (the Z direction) when the traveling carriage 11 travels. The connector 18 is described as a hinge in the present preferred embodiment, but it is not limited to, which includes an universal joint having a mechanism to rotate around a plurality of axes (for example, the X direction, the Y direction).

The lower end of each of the masts 12 and the lower support base 20 are connected by connectors 19. Each of the connectors 19 includes, for example, hinge and has an axis 19a (refer to FIG. 8B) in the perpendicular direction to the traveling direction of the traveling carriage 11 (the X direction) and also the horizontal direction (the Y direction). The connector 19 does not substantially transmit the moment around the axis 19a except for the influence of friction. The connectors 19 connect the lower support base 20 and the masts 12 so as to support the lower support base 20 and the masts 12 rotatably (freely rotatable) around the axes 19a.

In addition, the connector 19 receives the moment around two directions perpendicular to the axes 19a (the X direction, the Z direction), which is similar to the connector 18. The connector 19 prevents the mast 12 from being twisted by the lower support base 20 around the vertical direction (the Z direction). The connector 19 is described as hinge in the present preferred embodiment, but it is not limited to, which includes an universal joint having a mechanism to rotate around a plurality of axes (for example, the X direction, the Y direction).

In the stacker crane 3A shown in FIGS. 8A and 8B, when the traveling carriage 11 accelerates or decelerates, the masts 12 are rotated and inclined by an inertia force on the lower support base 20 side. However, as the lower support base 20 is rotatable around the connector 19 of the mast 12, the stacker crane 3A maintains the substantially horizontal state even in a state where the masts 12 are inclined. In view of the stacker crane 3A in the Y direction, a rectangular shape is formed by +x-side mast 12, -x-side mast 12, and upper and lower support base 20. This shape changes from rectangular to parallelogram upon the acceleration and deceleration of the traveling carriage as the lower support base 20 moves in a time delay and moves ahead of a position below the upper support base 17. However, the lower support base 20 can maintain the substantially horizontal state at the time of acceleration and deceleration.

The elevating platform 13 is, as shown in FIG. 8A, formed by connecting side and bottom plates via hinges 13a. Such hinges 13a rotatably connect the side and bottom plates of the elevating platform. The side plates enable the bottom plate of the elevating platform 13 to be horizontal by rotating along with the masts 12 when the masts 12 swing.

Figure 9:
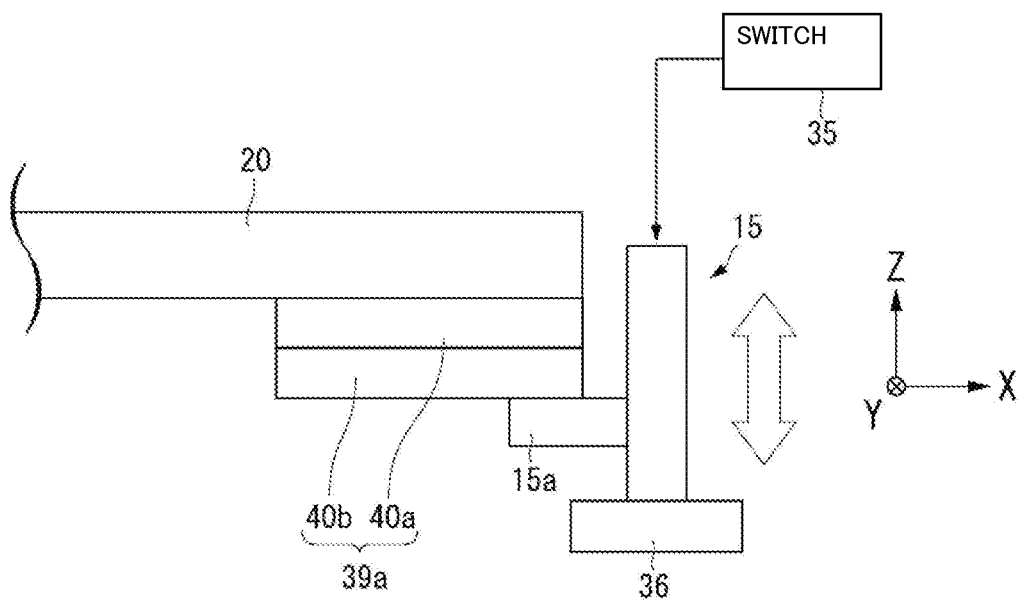
FIG. 9 is a diagram showing another example of the calibrator.

FIG. 9 is a diagram showing calibrators 39a according to another preferred embodiment of the present invention. In the FIG. 5C, the transfer conveyor 14 is adopted as the calibrator 39, however the calibrators 39a shown in FIG. 9 may be used instead of the calibrator 39. The calibrators 39a are, as shown in FIG. 9, provided on the undersurface of the lower support base 20 and also on the both sides of the traveling direction (the X direction). The calibrators 39a include a X axis slider 40a that can move from the undersurface of the lower support base 20 to the X direction and a Y axis slider 40b that can move from the undersurface of the X axis slider 40a to the Y direction. The stopper 15 includes a support 15a to support, advance, and retreat the outrigger 36. The Y axis slider 40b and the stopper 15 are connected by the support 15a.

The X axis slider 40a moves to the X direction by an X axis driver (not shown). The Y axis slider 40b moves to the Y direction by a Y axis driver (not shown). The calibrator 39a drive the X axis driver (not shown) and the Y axis driver (not shown) according to the deviation amount of the X direction (traveling direction) and the Y direction (transfer direction) detected by the detector 37 (refer to FIGS. 5A to 5C) to move the X axis slider 40a and the Y axis slider 40b, so that the relative position of the X direction (traveling direction) and the Y direction (transfer direction) toward the outrigger 36 can be adjusted via the support 15a.

This allows the lower support base 20 to be repositioned to the target stop position by driving the calibrators 39a after being fixed by the stoppers 15. The transfer conveyor 14 (refer to FIGS. 1A and 1B) can be placed at the appropriate position by this adjustment to accurately transfer the article 2 to the transfer destination. The structure shown in FIG. 9 is an example of an optional mechanism used by the stoppers 36 movable to the X direction (traveling direction) and the Y direction (transfer direction).

In the present preferred embodiment of the stacker cranes 3 and the stacker crane 3A, the weight of the mast 12 can be decreased as the mast 12 is suspended from the traveling carriage 11. Facility costs can also be reduced as a number of guide rails 41 are not required on the floor 6 within the facility. The stoppers 15 fix the lower portion of each of the masts 12 to the stationary object (the floor 6 or the traveling carriage 11) while the article 2 is transferred. This enables the elevating platform 13 and the transfer conveyor 14 to be positioned accurately. Thus, the transfer conveyor 14 is able to transfer the article 2 to the target position.

The preferred embodiments of the present invention have been explained in the above, however the technical scope of the present invention is not limited to preferred embodiments explained in, for example, the preferred embodiments. One or more features explained in the preferred embodiments may be omitted. Moreover, the features explained in the preferred embodiments may be combined accordingly. Furthermore, as laws and regulations permit, the disclosure of Japanese patent applications No. 2016-204184, No. 2016-204185 and all documents cited in the description shall be incorporated and employed as a part of the contents of this description.

Overhead hoist vehicles set on the transport systems 1A, 1B may use at least a portion of the track 4 as a rail. In the preferred embodiments of the present invention, the track 4 preferably is provided on the ceiling 5 of the facility via the rail supports 5a. In another example, the track 4 may be provided directly on the ceiling 5 or, for example, on a frame (beam) near the ceiling 5. As explained in the preferred embodiments of the transport systems, the stoppers 15 come into contact with the floor 6 and fix the masts 12 to the floor 6. In another example, the stoppers 15 may come into contact with a structure fixed on the floor 6 or the stationary object such as various devices and fix the lower portion of each of the masts 12 to the stationary object.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A stacker crane comprising:
a carriage driver;
a traveling carriage to travel along a track;
at least one mast suspended from the traveling carriage;
an elevating platform guided along the at least one mast so as to freely move up and down;
a transfer conveyor located on the elevating platform to transfer an article;
at least one stopper to fix the at least one mast;
a switch to switch a state of the at least one mast between a fixed state and a released state by the at least one stopper;
a detector to detect a deviation from a predetermined stop position of a lower portion of the at least one mast fixed by the at least one stopper; and
a calibrator to adjust the deviation detected by the detector; wherein the switch controls the at least one stopper to release fixation of the at least one stopper and enables the lower portion of the at least one mast to follow an upper portion of the at least one mast in a traveling direction when the carriage driver drives the traveling carriage, and the switch controls the at least one stopper to fix the at least one mast when the carriage driver stops the traveling carriage; and the calibrator adjusts a stroke length to transfer the article by the transfer conveyor or a position of the transfer conveyor based on the predetermined stop position of the lower portion of the at least one mast.

2. The stacker crane according to claim 1, further comprising a lower support base to connect the lower portion of the at least one mast, wherein the at least one mast is attached to both sides of the elevating platform in the traveling direction of the traveling carriage; and the at least one stopper is mounted on the lower support base.

3. The stacker crane according to claim 2, wherein the at least one stopper advances and retreats so as to contact with or separate from a floor.

4. The stacker crane according to claim 3, wherein the at least one stopper anchors to the lower support base on both sides of the traveling direction.

5. The stacker crane according to claim 2, further comprising at least one guide roller arranged at the lower support base to direct the traveling carriage through a rail located on a floor and partially under the track.

6. The stacker crane according to claim 2, wherein during transfer of the article, the switch enables the at least one stopper to contact a floor to fix the lower support base to the floor.

7. The stacker crane according to claim 6, wherein when the transfer of the article is completed, the switch moves the at least one stopper upward and away from the floor.

8. The stacker crane according to claim 1, wherein a guide roller is disposed at the lower portion of the at least one mast to guide the traveling carriage along a rail on a floor in a section of the track.

9. The stacker crane according to claim 1, further comprising at least one mast guide disposed on the elevating platform to guide the elevating platform along the at least one mast.

10. The stacker crane according to claim 1, wherein the transfer conveyor transfers the article in a direction perpendicular and horizontal to the traveling direction of the traveling carriage; and a rigidity of the at least one mast in the direction perpendicular and horizontal to the traveling direction of the traveling carriage is higher than that of the at least one mast in the traveling direction of the traveling carriage.

11. The stacker crane according to claim 1, further comprising a suppressor to reduce or prevent oscillation or vibration of the at least one mast.

12. The stacker crane according to claim 1, wherein the calibrator adjusts the stroke length to transfer the article by the transfer conveyor or calibrates the position of the transfer conveyor when the lower portion of the at least one mast is fixed.

13. The stacker crane according to claim 1, wherein the carriage driver decelerates the traveling carriage at least once during driving of the traveling carriage.

14. The stacker crane according to claim 1, wherein the carriage driver increases acceleration of the traveling carriage at least once during driving of the traveling carriage.

15. The stacker crane according to claim 1, wherein the transfer conveyor includes an arm and a holder to hold the article.

16. The stacker crane according to claim 1, wherein when the traveling carriage travels, a weight of the stacker crane supported by a ceiling is larger than a weight of the stacker crane supported by a floor.

17. The stacker crane according to claim 16, wherein, when the traveling carriage travels, a total weight of the stacker crane or substantially the total weight of the stacker crane is supported by the track attached to the ceiling.

18. The stacker crane according to claim 1, wherein the switch switches between the fixed state and the released state by moving forward or backward the at least one stopper.

19. The stacker crane according to claim 1, wherein when the at least one stopper has fixed the at least one mast, a relative position between a transfer destination and the elevating platform is determined.

20. The stacker crane according to claim 1, wherein the at least one stopper includes at least one anchor or at least one outrigger.

21. The stacker crane according to claim 1, wherein the detector detects the deviation in at least one of a transfer direction or the traveling direction.

* * * * *